US011069105B2

(12) United States Patent
Nguyen et al.

(10) Patent No.: US 11,069,105 B2
(45) Date of Patent: Jul. 20, 2021

(54) VIRTUAL MAKE-UP APPARATUS AND VIRTUAL MAKE-UP METHOD

(71) Applicant: PANASONIC INTELLECTUAL PROPERTY MANAGEMENT CO., LTD., Osaka (JP)

(72) Inventors: Phu Nguyen, Fukuoka (JP); Yoshiteru Tanaka, Fukuoka (JP); Hiroto Tomita, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/339,277

(22) PCT Filed: Aug. 23, 2017

(86) PCT No.: PCT/JP2017/030024
§ 371 (c)(1),
(2) Date: Apr. 3, 2019

(87) PCT Pub. No.: WO2018/070106
PCT Pub. Date: Apr. 19, 2018

(65) Prior Publication Data
US 2020/0051298 A1 Feb. 13, 2020

(30) Foreign Application Priority Data
Oct. 14, 2016 (JP) .............................. JP2016-203131

(51) Int. Cl.
*G06T 11/60* (2006.01)
*G06T 11/00* (2006.01)
(52) U.S. Cl.
CPC ............ *G06T 11/60* (2013.01); *G06T 11/001* (2013.01)

(58) Field of Classification Search
CPC ......... G06T 11/60; G06T 11/001; G06T 1/00; G06F 30/00
(Continued)

(56) References Cited
U.S. PATENT DOCUMENTS

2009/0226086 A1\* 9/2009 Kasahara ................. H04N 5/20
382/167
2009/0231356 A1\* 9/2009 Barnes ................ G06F 3/04883
345/594
(Continued)

FOREIGN PATENT DOCUMENTS

| JP | 2000-011145 A | 1/2000 |
| JP | 2012-256130 A | 12/2012 |
| JP | 2016-110416 A | 6/2016 |

OTHER PUBLICATIONS

Sumi et al., "A Facial Image Beautifying System with Slimming Effect Using Interactive Evolutionary Computing", IEICE Technical Report, vol. 110, No. 322, Nov. 25, 2010, pp. 17-21 and English translation thereof.
(Continued)

*Primary Examiner* — Jennifer Mehmood
*Assistant Examiner* — Kim Thanh T Tran
(74) *Attorney, Agent, or Firm* — Greenblum & Bernstein, P.L.C.

(57) ABSTRACT

This virtual make-up apparatus extracts an object portion image of a virtual make-up from a facial image captured by a camera, applies, on the object portion image, a color corresponding to an item in accordance with designation of the item for the virtual make-up, and adds a texture component different for each item, to a part of the object portion image. The virtual make-up apparatus displays, on a display unit, a virtual make-up image in which a virtual make-up using an item is applied on the facial image, by using the object portion image to which color is applied, an image in
(Continued)

which a texture component is added to the part of the object portion image, and the object portion image of the virtual make-up of the facial image.

6 Claims, 13 Drawing Sheets

(58) Field of Classification Search
USPC .......................................................... 345/619
See application file for complete search history.

(56) References Cited

U.S. PATENT DOCUMENTS

| 2014/0016823 | A1* | 1/2014 | Ye .......................... G06T 15/503 |
| | | | 382/103 |
| 2014/0185931 | A1 | 7/2014 | Aoki |
| 2015/0248581 | A1* | 9/2015 | Gouda .................. G06T 19/006 |
| | | | 345/633 |
| 2017/0076474 | A1* | 3/2017 | Fu .......................... G06T 3/0093 |
| 2018/0075523 | A1* | 3/2018 | Sartori Odizzio ............................ |
| | | | G06Q 30/0643 |

OTHER PUBLICATIONS

International Search Report issued in International Pat. Appl. No. PCT/JP2017/030024, dated Oct. 17, 2017 and English translation thereof.

\* cited by examiner

AVERAGE COLOR OF LIP

AVERAGE COLOR OF LIPSTICK

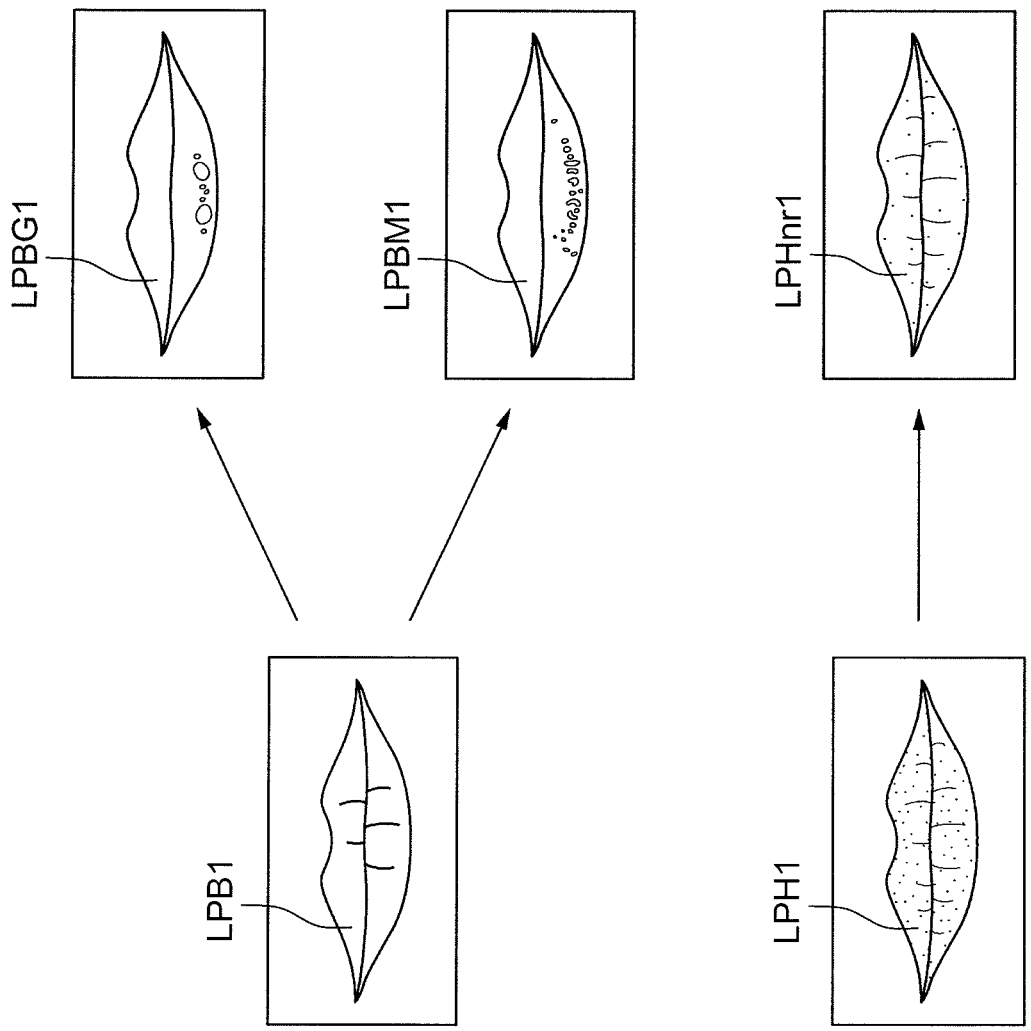

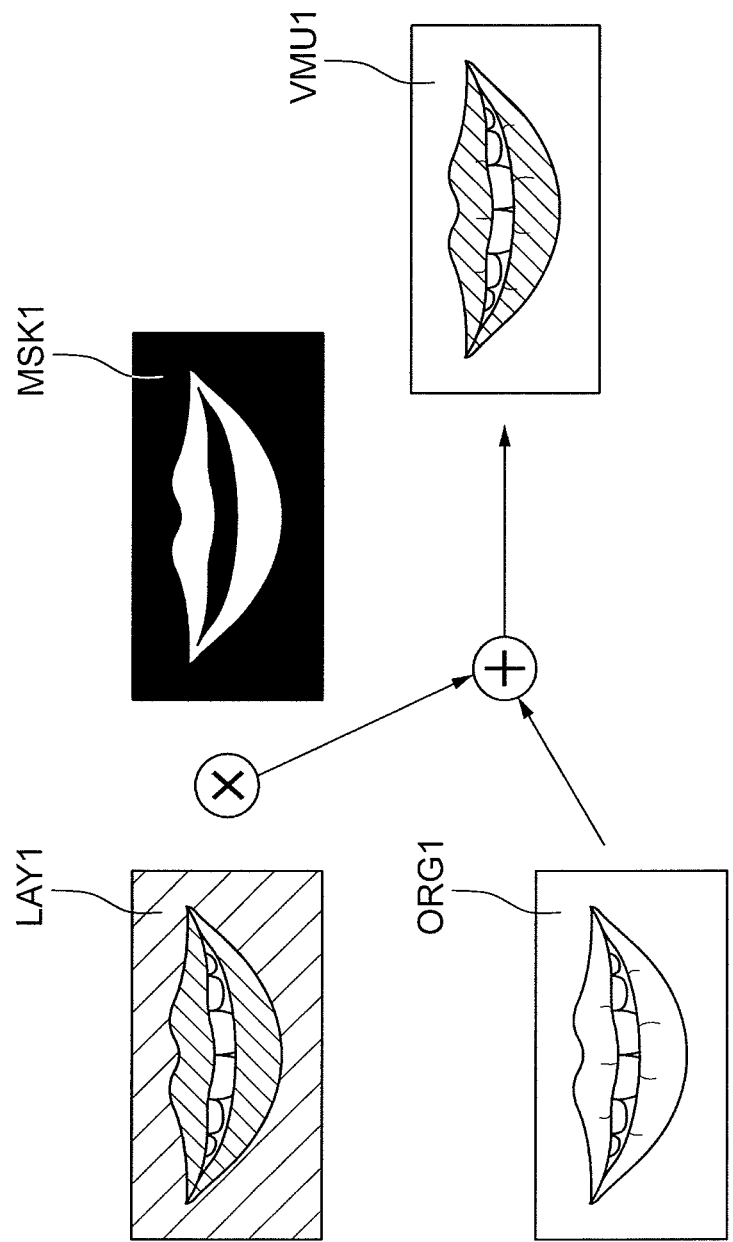

VIRTUAL MAKE-UP APPARATUS AND VIRTUAL MAKE-UP METHOD

TECHNICAL FIELD

The present disclosure relates to a virtual make-up apparatus and a virtual make-up method, for performing a virtual make-up on a facial image.

BACKGROUND ART

For example, the technique described in PTL 1 relates to virtual make-up that implements virtual make-up by performing an image process on a captured image of a person's face. In this technique, the average value of hue, saturation, and lightness of pixels of representative color in the lip region extracted from the facial image of the three primary colors is calculated, and a reapply deviation between a target lipstick color to be reapplied and the average value of pixels of representative color is calculated. Further, in this technique, the hue, saturation, and lightness of a new pixel are calculated by adding the reapply deviation to the hue, saturation, and lightness of each pixel in the lip region, and each pixel is converted into a pixel used for display of the three primary colors. Thus, a facial image in which the color of lipstick is reapplied in the form of hue, saturation, and brightness close to the characteristics of human eyes is obtained.

In recent years, various types of texture (texture feeling) given by lipstick are also appearing variously. As types of texture, for example, gloss giving outstanding texture of the luster or the gloss, matte giving a texture emphasizing color almost without shiny sense or luster, creme giving a texture of a soft impression like a lip cream which does not have transparency and is not sticky are known. The type of texture is not limited to these, and lipstick giving a lot of other texture is appearing.

An object of the present disclosure is to perform virtual make-up on a face video while virtually giving a unique texture different for each cosmetic product, individually express various types of textures, and improve user's convenience.

CITATION LIST

Patent Literature

PTL 1: Japanese Patent Unexamined Publication No. 2000-011145

SUMMARY OF THE INVENTION

A virtual make-up apparatus according to the present disclosure includes an object portion extraction unit that extracts an object portion image of a virtual make-up from a facial image captured by a camera; a color application processing unit that in accordance with designation of an item of the virtual make-up, applies a color corresponding to the designated item on the object portion image; a texture control unit that adds a texture component different for each designated item, to a part of the object portion image; and a display control unit that displays on a display unit, a virtual make-up image in which the virtual make-up using the item is applied on the facial image, by using an output image of the color application processing unit, an output image of the texture control unit, and the object portion image of the virtual make-up of the facial image.

A virtual make-up method according to the present disclosure includes extracting an object portion image of a virtual make-up from a facial image captured by a camera; applying, in accordance with designation of an item of the virtual make-up, a color corresponding to the designated item on the object portion image; adding a texture component different for each designated item, to a part of the object portion image; and displaying on a display unit, a virtual make-up image in which the virtual make-up using the item is applied on the facial image, by using the object portion image to which color is applied, an image in which the texture component is added to the part of the object portion image, and the object portion image of the virtual make-up of the facial image.

According to the present disclosure, it is possible to perform virtual make-up on a face video while virtually giving a unique texture different for each cosmetic product, individually express various types of textures, and improve user's convenience.

BRIEF DESCRIPTION OF DRAWINGS

FIG. 11A is a schematic diagram showing an example of an output image of the wrinkle and gloss control unit.

FIG. 11B is a schematic diagram showing an example of an output image of a noise suppression unit.

FIG. 12 is an explanatory diagram of an example of an operation outline of generation of a virtual make-up image in a make-up superposition processing unit.

DESCRIPTION OF EMBODIMENTS

Hereinafter, referring to the diagrams as appropriate, an exemplary embodiment in which a virtual make-up apparatus, a virtual make-up method, and a virtual make-up program according to the present disclosure are specifically disclosed (hereinafter referred to as "the exemplary embodiment") will be described in detail. However, a detailed description more than necessary may be omitted. For example, detailed descriptions of already well-known matters and duplicate descriptions of substantially identical components may be omitted in some cases. This is to avoid the unnecessary redundancy of the following description and to facilitate understanding by those skilled in the art. In addition, the accompanying drawings and the following description are provided to enable those skilled in the art to fully understand the present disclosure, and are not intended to limit the subject matter described in the claims.

<Outline of Apparatus>

First, an outline of virtual make-up apparatus 100 according to the present exemplary embodiment will be described with reference to FIG. 1 and FIG. 2.

Figure 1:
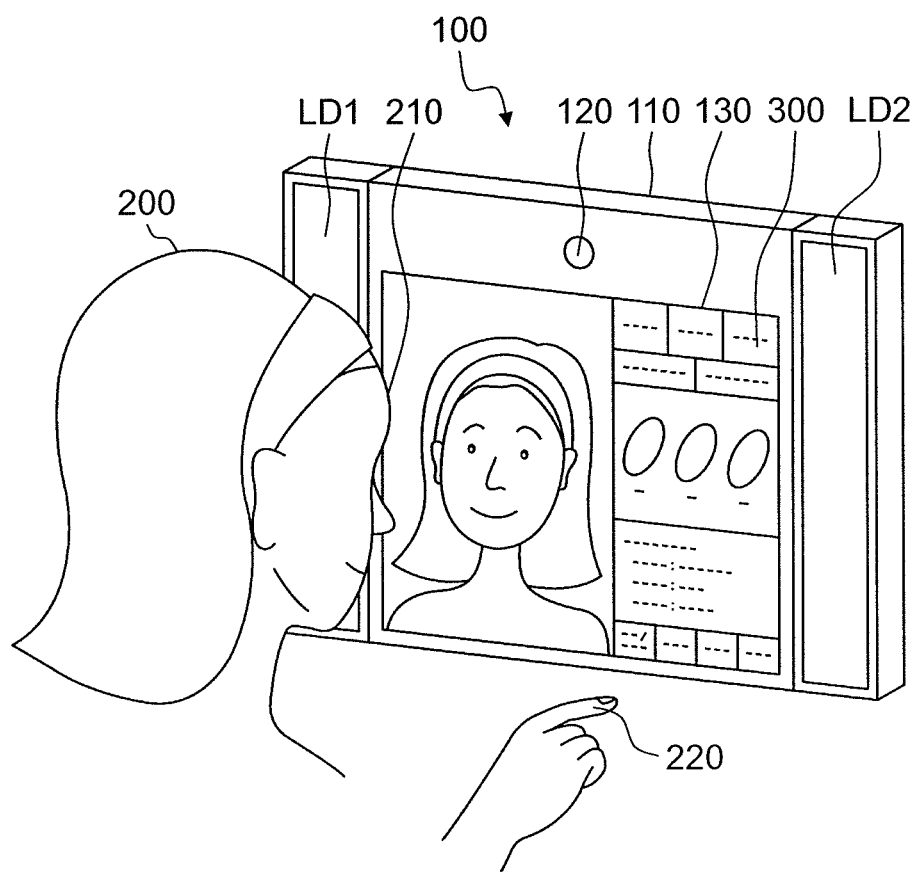
FIG. 1 is a view showing an example of a use state of a virtual make-up apparatus of an exemplary embodiment.

FIG. 1 is a view showing an example of the use state of virtual make-up apparatus 100 of the present exemplary embodiment.

As shown in FIG. 1, virtual make-up apparatus 100 is housed in housing 110 of a substantially rectangular parallelepiped shape that can be stood on a flat surface (for example, a table, not shown) of a store or the like, and for example, is a tablet type terminal having display 130 with touch panel. On the main surface of housing 110 in which virtual make-up apparatus 100 is housed, camera 120 is disposed. On the left and right sides of housing 110 of virtual make-up apparatus 100, light emission diode (LED) lightings LD1, LD2 capable of illuminating user 200 (in particular, face 210 of the user) are integrally disposed. LED lightings LD1, LD2 are housed in a housing having the same height as the height of housing 110, and irradiate user 200 with illumination light from both right and left sides, respectively. In other words, LED lightings LD1, LD2 are disposed so as to be parallel to housing 110 and face user 200.

The relative position between user 200 and virtual make-up apparatus 100 is individually adjusted by user 200 such that, for example, face 210 of the user is included within the angle of view of camera 120, user 200 can see display 130 with touch panel, and finger 220 of the user can touch display 130 with touch panel.

Camera 120 is, for example, a digital camera having an autofocus function, and images face 210 of user 200. Hereinafter, the image of face 210 imaged by camera 120 is simply referred to as "facial image".

Display 130 with touch panel displays virtual make-up screen 300 which is a user interface for performing virtual make-up on the facial image. Here, the virtual make-up is an image process of virtually implementing make-up for each designated item on the facial image captured by camera 120, when user 200 designates an item (for example, a cosmetic product such as lipstick) displayed on virtual make-up screen 300.

Figure 2:
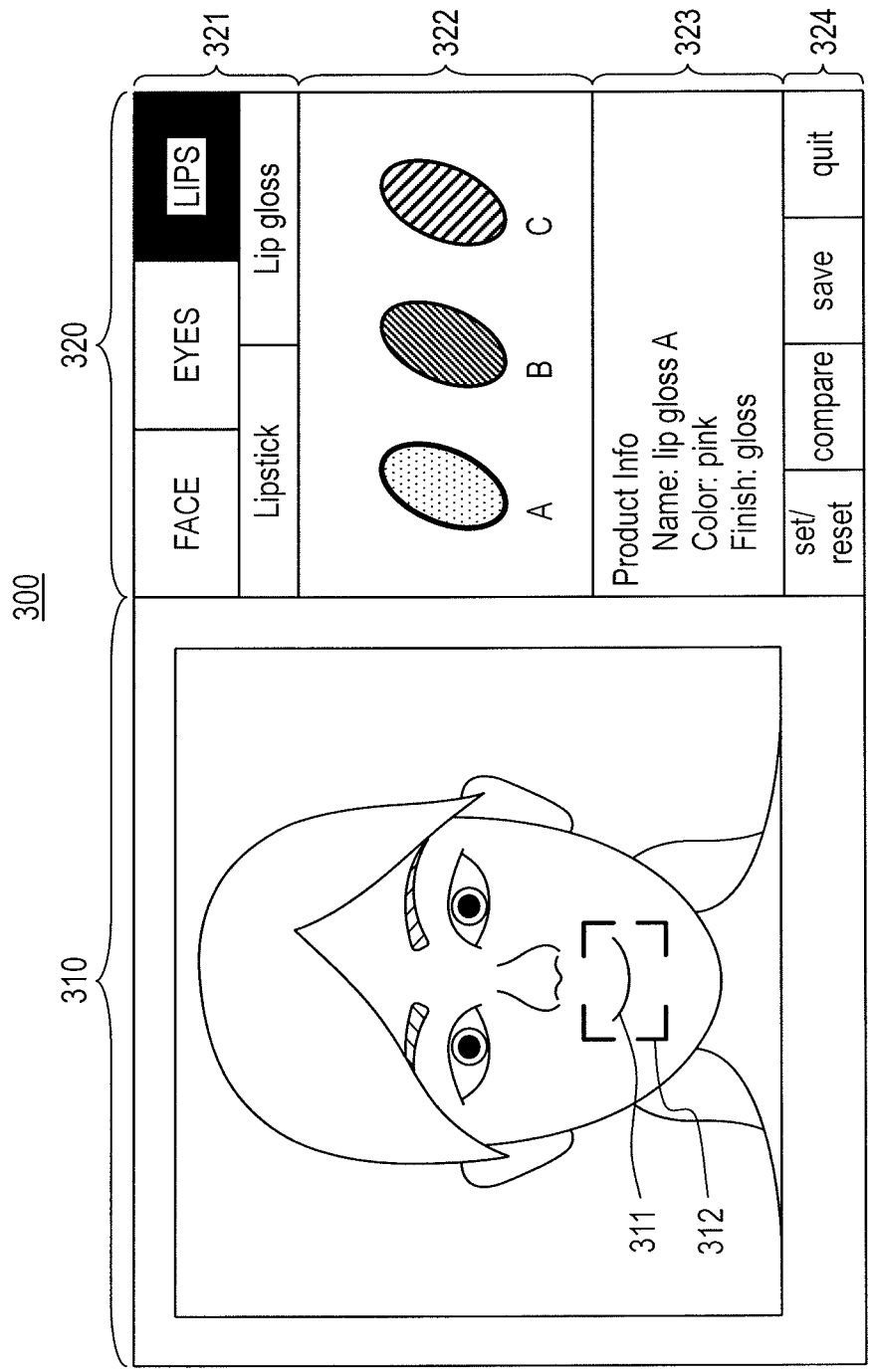
FIG. 2 is a view showing an example of a virtual make-up screen of the present exemplary embodiment.

FIG. 2 is a view showing an example of virtual make-up screen 300 of the present exemplary embodiment.

As shown in FIG. 2, virtual make-up screen 300 includes video display region 310 and operation receiving region 320, and is displayed on display 130 with touch panel, in accordance with an operation on virtual make-up apparatus 100 of user 200.

In video display region 310, a face video composed of mirror images of a plurality of facial images captured by camera 120 is displayed in real time. In addition, video display region 310 may display a snapshot (still image) of face 210 at a certain point imaged by camera 120. In response to an operation on operation receiving region 320, video display region 310 displays a virtual make-up image (for example, virtual make-up image VMU1 shown in FIG. 12) determined based on the operation by superimposing the virtual make-up image on a face video.

Here, "real time" is a concept including a delay time that is small enough to have a feeling close to the feeling that user 200 is looking at the mirror. Further, the virtual make-up image is an image indicating a state where a virtual make-up is made when a make-up using a cosmetic item (for example, a cosmetic product such as lipstick or eye shadow) selected by the designation on operation receiving region 320 is applied on a corresponding face part (for example, lip or eyelid).

Operation receiving region 320 includes, for example, item selection area 321, texture selection area 322, detailed product information area 323, and process selection area 324.

Item selection area 321 is used for receiving an operation of selecting a cosmetic item to be operated, from among a plurality of predetermined cosmetic items. In addition, item selection area 321 may be used for hierarchically receiving a selection operation in accordance with a large classification or a small classification, for example.

Texture selection area 322 is used for receiving an operation to select a texture of a predetermined type for each cosmetic item selected in item selection area 321 (in other words, a specific individual cosmetic item that can add a unique texture, respectively). That is, item selection area 321 and texture selection area 322 are used to receive an operation of designating the contents of the virtual make-up (hereinafter also referred to as "make-up designation operation"). For example, various types of textures are also present in lip gloss (so-called gloss) for each cosmetic manufacturer and for each cosmetic product, and FIG. 2 exemplifies three types of cosmetic items A, B, and C having different colors and textures, depending on the combination of large or small level of good coloring, luster, shiny state, wrinkle feeling, and the like. It goes without saying that the color and texture of the lip gloss is not limited to three types of cosmetic items A, B, and C having different colors and textures. Further, in FIG. 2, three types are exemplified as combinations of cosmetic items having different colors and textures in lip gloss, but the present invention is not limited to lip gloss, but for example, a different type (color and texture) such as matte or cream may be selected, and then, in the selected type, a cosmetic item may be selected like a cosmetic item A, B, or C. The cosmetic item (for example, lipstick) selected by user 200 has individually color and texture. Therefore, when one of the cosmetic items (for example, lipstick) is selected by user 200, the unique texture of the selected cosmetic item (for example, lipstick) is selected by user 200.

Detailed product information area 323 is an area for displaying detailed information on the cosmetic items and textures respectively selected in item selection area 321 and texture selection area 322. For example, the name of the cosmetic product designated (selected) by user 200 is "lip gloss A", the color is "pink", and the texture of finish is "gloss". As described above, various types of information of "name", "color", and "texture" are associated and held in virtual make-up apparatus 100 for each cosmetic product to be designated (selected). Note that these pieces of information may be stored in a database (not shown) externally connected to virtual make-up apparatus 100. In this case, virtual make-up apparatus 100 may access the database and acquire various types of information of the cosmetic item each time user 200 designates (selects) a cosmetic item.

Process selection area 324 is used to receive an operation of selecting a process to be executed with respect to information (hereinafter also referred to as "make-up designation information") indicating the contents of the virtual make-up designated by the make-up designation operation. The process to be executed includes a preview display of a virtual make-up image corresponding to make-up designation information, a comparison of facial images before and after virtual make-up, a process of recording make-up designation information designated by user 200 and identification information of user 200 in association with each other, an end of a process of virtual make-up, and the like.

The face video imaged by camera 120 is continuously displayed in real time in video display area 310. Virtual make-up apparatus 100 starts the autofocus operation of camera 120 upon detecting the make-up designation operation, and does not perform the autofocus operation unnecessarily unless the make-up designation operation is detected.

For example, virtual make-up apparatus 100 sequentially determines whether or not an operation of selecting a cosmetic item (hereinafter also referred to as "item selection operation") has been performed in item selection area 321. When an item selection operation is performed, virtual make-up apparatus 100 performs a focusing operation of camera 120 with a face part (for example, lip 311) corresponding to the selected cosmetic item (for example, lipstick) as a focus position. In addition, virtual make-up apparatus 100 may display focus frame 312 indicating the focus position to be superimposed on the face video of video display area 310.

When user 200 (see FIG. 1) intends to start, for example, virtual make-up of the lip, first, user 200 selects lipstick in item selection area 321. With this selection, virtual make-up apparatus 100 instantly brings the focus to the lip, which is the face part corresponding to lipstick, and displays the face video in which the lip that user 200 is paying attention is clearly projected. That is, virtual make-up apparatus 100 can clearly display the face part that user 200 is paying attention as a virtual make-up object only when there is an item selection operation of virtual make-up.

<Details of Apparatus>

Hereinafter, the configuration and operation of virtual make-up apparatus 100 will be described in detail.

First, the internal configuration of virtual make-up apparatus 100 will be described with reference to FIG. 3.

Figure 3:
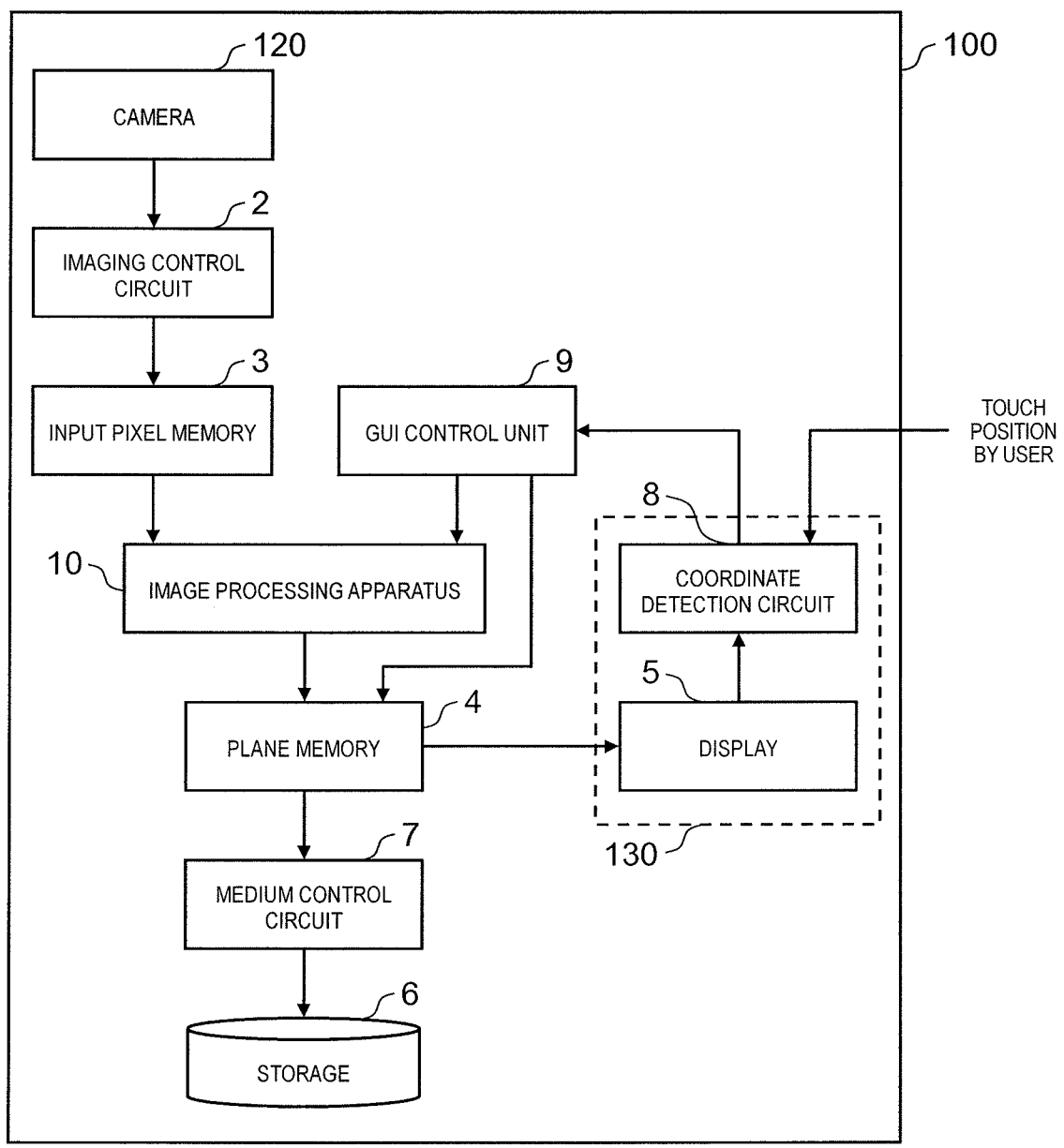
FIG. 3 is a block diagram showing in detail an example of the internal configuration of the virtual make-up apparatus of the present exemplary embodiment.

FIG. 3 is a block diagram showing in detail an example of the internal configuration of virtual make-up apparatus 100 of the present exemplary embodiment.

Virtual make-up apparatus 100 includes camera 120, imaging control circuit 2, input pixel memory 3, plane memory 4, display 5, storage 6, medium control circuit 7, coordinate detection circuit 8, graphical user interface (GUI) control unit 9, and image processing apparatus 10. Display 130 with touch panel may be configured with display 5 and coordinate detection circuit 8.

Camera 120 performs photoelectric conversion on a subject image formed on an image sensor (not shown) by lenses (for example, a focus lens and a zoom lens) constituting an imaging optical system, and generates a video signal of an object (for example, the face of user 200).

Imaging control circuit 2 performs exposure control using a focus lens, a zoom lens, and a shutter and diaphragm, which constitute an imaging optical system of camera 120.

Input pixel memory 3 is configured with, for example, a random access memory (RAM), and temporarily stores image data (frame) of the facial image of user 200 to be processed by the virtual make-up.

Plane memory 4 is configured with a semiconductor memory such as a flash memory, for example, and temporarily stores data of image (that is, the virtual make-up image) as the processing result of the virtual make-up on the image data stored in input pixel memory 3.

Display 5 as an example of a display unit is configured with, for example, a liquid crystal display (LCD), a plasma display panel (PDP), or an organic electroluminescence (EL) element, and displays an original facial image captured by camera 120 or the facial image after the virtual make-up.

Storage 6 is configured with a semiconductor memory such as a flash memory, a hard disk drive (HDD) or a solid state drive (SSD), and stores various types of information or data (for example, a virtual make-up image generated by virtual make-up apparatus 100).

Medium control circuit 7 writes the image data stored in plane memory 4 to storage 6, and reads it from storage 6 as necessary.

Coordinate detection circuit 8 detects an input operation (for example, a touch operation, a flick operation) from user 200, and detects a position (that is, a coordinate) on display 5 on which the detected input operation is performed.

GUI control unit 9 outputs an event according to the coordinates detected by coordinate detection circuit 8 and updates the GUI. For example, according to the coordinates detected by coordinate detection circuit 8 (for example, the coordinates of the icon for instructing the display of virtual make-up screen 300), GUI control unit 9 executes an event (for example, generation of virtual make-up screen 300), and displays the processing result (for example, virtual make-up screen 300) of the event on display 5. Here, the GUI is configured with various widgets such as windows, scroll bars, radio buttons, text boxes, and pull-down menus. In order to change these states, in a case where an input operation (for example, touch) of user 200 on the screen (for example, virtual make-up screen 300) displayed on display 5 occurs, GUI control unit 9 outputs an event related to the touch coordinates and changes the state of each widget. Virtual make-up apparatus 100 can provide an interactive operation environment using the GUI to the user by such a state change of the widget.

Image processing apparatus 10 executes image processing for virtual make-up. Details of the configuration of image processing apparatus 10 will be described later with reference to FIG. 4. In the following description, for example, an example in which user 200 selects one of plural types of lipsticks having various types of colors and textures, as a cosmetic item of virtual make-up and enjoys virtual make-up will be described.

Figure 4:
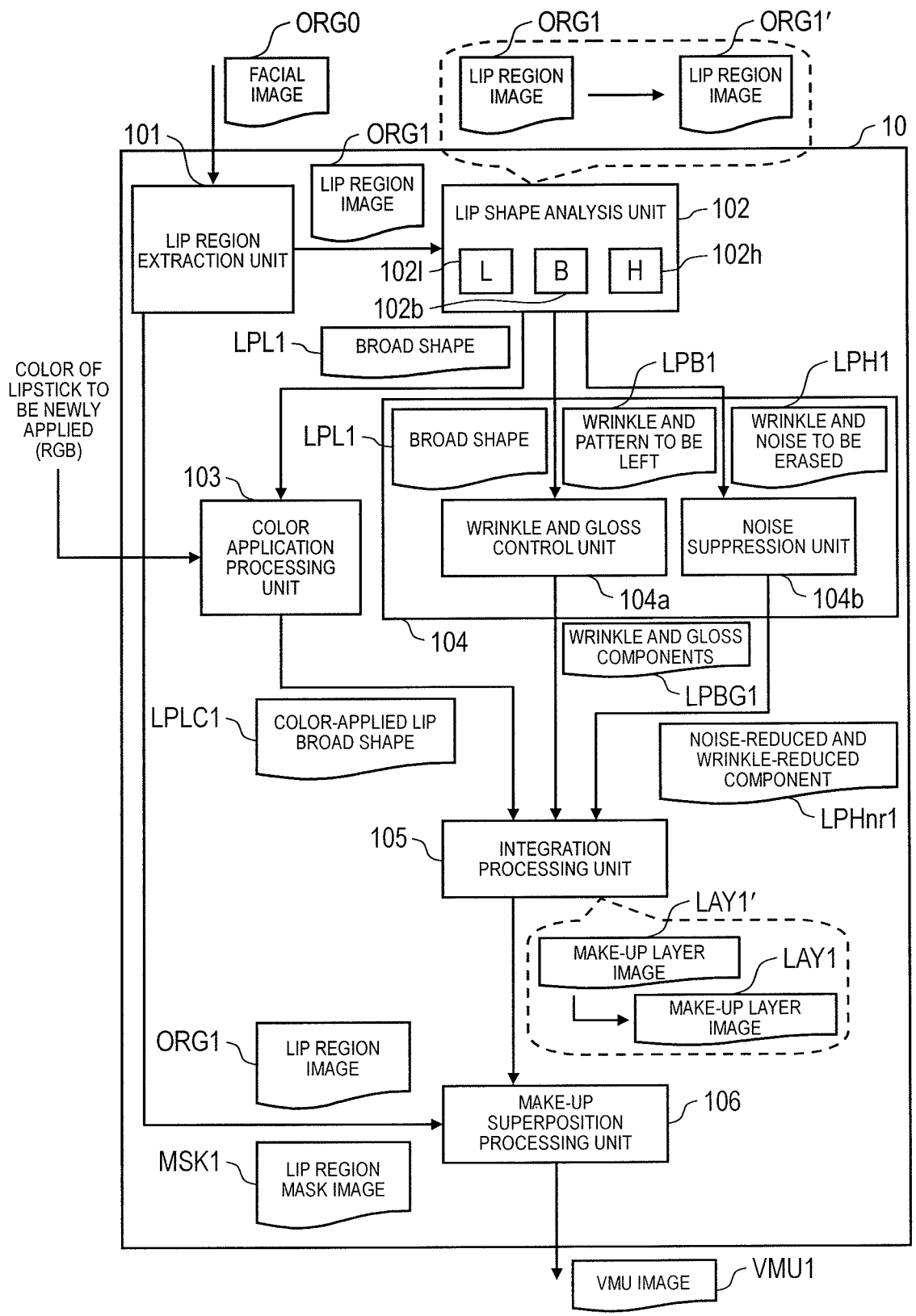
FIG. 4 is a diagram in which a data flow between constituent elements is added to hardware or software constituent elements constituting an image processing apparatus of the present exemplary embodiment.

FIG. 4 is a diagram in which a data flow between constituent elements is added to hardware or software constituent elements constituting image processing apparatus 10 of the present exemplary embodiment.

Image processing apparatus 10 includes lip region extraction unit 101, lip shape analysis unit 102, color application processing unit 103, texture control unit 104, integration processing unit 105, and make-up superposition processing unit 106. Texture control unit 104 includes wrinkle and gloss control unit 104a and noise suppression unit 104b. Lip region extraction unit 101, lip shape analysis unit 102, color application processing unit 103, texture control unit 104, integration processing unit 105, and make-up superposition processing unit 106 are processors (for example, a central processing unit (CPU), a micro processing unit (MPU), or a digital signal processor (DSP)). The input of image processing apparatus 10 is facial image ORG0 of the three primary colors (for example, RGB color space) and the color (RGB value) of lipstick to be reapplied, and the output of image processing apparatus 10 is virtual make-up image VMU1 of an RGB image in which the lip region of facial image ORG0 is reapplied with lipstick application color to be reapplied.

The object of image processing for virtual make-up includes both the lip of the no-make and the lip on which lipstick has already been applied. In a case where the lip which has already been applied with lipstick is to be subjected to image processing, the optical characteristics due to the lipstick are also reflected in the virtual make-up facial image, so realistic virtual make-up can be realized also in this case.

Figure 5:
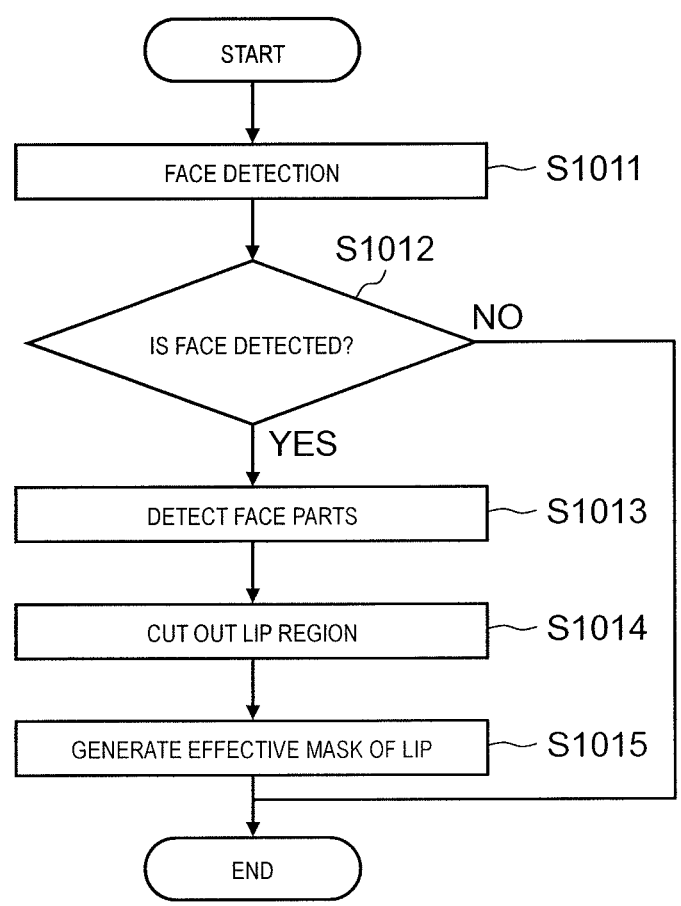
FIG. 5 is a flowchart for explaining in detail an example of an operation procedure of a lip region extraction unit.

FIG. 5 is a flowchart for explaining in detail an example of an operation procedure of lip region extraction unit 101.

Lip region extraction unit 101 as an example of object portion extraction unit extracts an object portion image of a virtual make-up (for example, a lip image) from original facial image ORG0 captured by camera 120. Specifically, lip region extraction unit 101 performs face detection from original facial image ORG0 (S1011), and in a case where a face is detected (YES in S1012), lip region extraction unit 101 detects face parts (for example, eyes, nose, mouth) (S1013). In a case where a face is not detected (that is, face cannot be detected) (NO in (S1012), the process of lip region extraction unit 101 of FIG. 5 is ended.

Lip region extraction unit 101 detects the feature point of face by using the face detection result and the face part detection result, extracts the feature point defining the lip part, and generates the contour line connecting the feature points. As a method of extracting the feature point defining the lip part, for example, various methods such as segmentation by color, edge detection and part detection by face model can be adopted. Lip region extraction unit 101 uses, for example, lip region detection by detecting face parts. Lip region extraction unit 101 cuts out lip region image ORG1 in which a region of a lip part is designated by the contour line from original facial image ORG0 (S1014). Lip region extraction unit 101 outputs lip region image ORG1 to lip shape analysis unit 102. Further, lip region extraction unit 101 generates lip region mask image MSK1 for masking the area surrounded by the lip feature points as an effective region, according to the region designation of the lip part (S1015). Lip region extraction unit 101 outputs lip region mask image MSK1 and lip region image ORG1 to make-up superposition processing unit 106.

Figure 7:
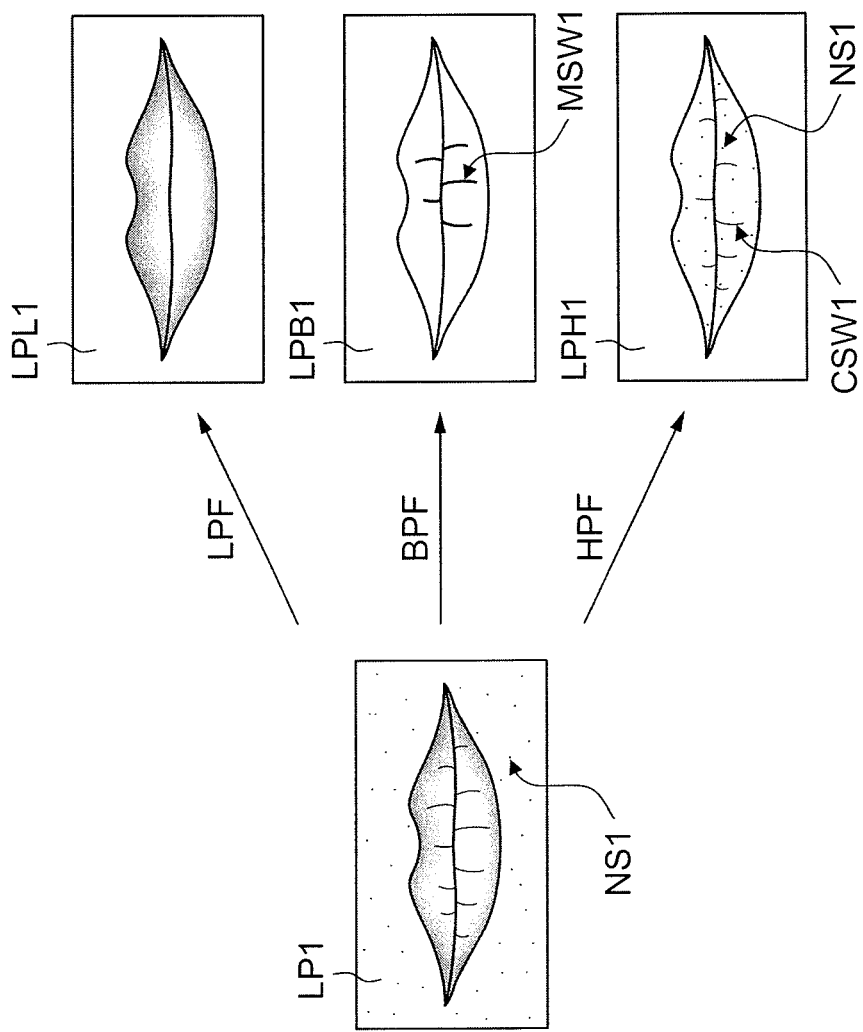
FIG. 7 is a schematic diagram of an example of an operation outline of shape analysis in the lip shape analysis unit.

Lip shape analysis unit 102 converts the color space of lip region image ORG1 (for example, RGB. It is also possible to convert YUV) in which the region of the lip part is designated into a processing intermediate color space, and temporarily stores the conversion result in a memory (for example, plane memory 4). HCL color space that can be represented by hue (H), chroma (C), and luminance (L) can be cited as a processing intermediate color space. In order to determine what frequency component lip region image ORG1 having information of hue, saturation, and luminance has, using for example, fast Fourier transform or discrete Fourier transform, lip shape analysis unit 102 converts the output image of lip region extraction unit 101 (that is, lip region image ORG1 in the spatial domain) into lip region image ORG1' in the spatial frequency domain (see FIG. 7). Lip region image ORG1' shown in FIG. 7 is, for example, a rectangular image including a lip region, and is indicated only by the luminance value of each of pixels constituting the lip region.

Figure 6:
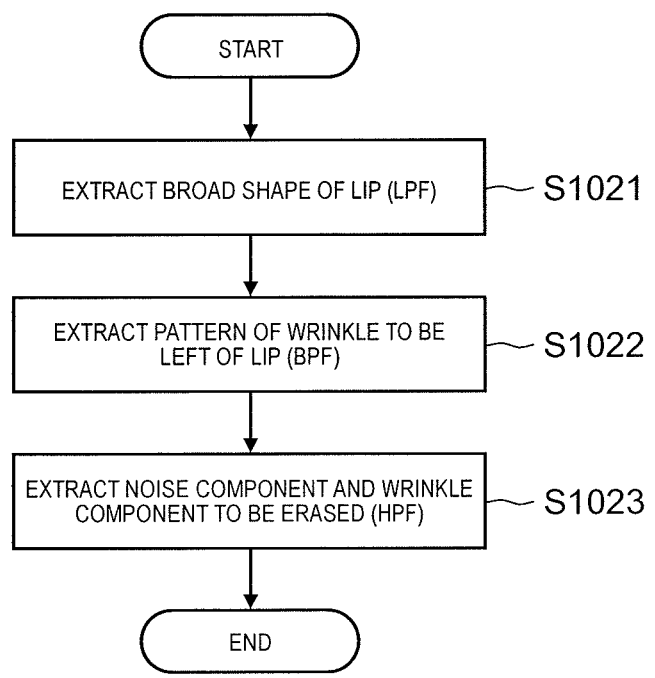
FIG. 6 is a flowchart for explaining in detail an example of an operation procedure of a lip shape analysis unit.

FIG. 6 is a flowchart for explaining in detail an example of an operation procedure of lip shape analysis unit 102. FIG. 7 is a schematic diagram of a schematic outline example of the shape analysis in lip shape analysis unit 102.

Lip shape analysis unit 102 includes three types of filters (specifically, a low pass filter (LPF) 102*l*, a band pass filter (BPF) 102*b*, and a high pass filter (HPF) 102*h*).

Lip shape analysis unit 102 uses LPF102*l* to extract an image signal including signal components equal to or lower than a first cut-off frequency (predetermined value) of LPF 102*l* from lip region image ORG1' in the spatial frequency domain (S102*l*). This image signal corresponds to image signal LPL1 of the broad shape of the lip of user 200 (that is, rough uneven shape of the lip) (see FIG. 7). Image signal LPL1 shown in FIG. 7 is an image having a rectangular contour including a lip region including a result of subtracting a predetermined value as an offset from the luminance value of each pixel constituting the lip region. For example, focusing on the fact that the lip after the virtual make-up and the lip before the virtual make-up are not much different in the shapes, the output of LPF 102*l* of lip region image ORG1' is used as a base (frame) portion of make-up layer image LAY1 to be described later. Lip shape analysis unit 102 outputs image signal LPL1 to color application processing unit 103 and wrinkle and gloss control unit 104*a*, respectively.

Lip shape analysis unit 102 uses BPF 102*b* to extract an image signal including signal components of a predetermined frequency band of BPF 102*b* from lip region image ORG1' in the spatial frequency domain (S1022). The image signal corresponds to image signal LPB1 of pattern MSW1 of a wrinkle which can be regarded as a characteristic part of the lip of user 200 (see FIG. 7). Image signal LPB1 shown in FIG. 7 is an image having a rectangular contour including a lip region, having an image component of pattern MSW1 of a deep wrinkle appearing in the lip region. Focusing on the fact that deep wrinkle appearing on the lip is likely to be left even after actual make-up, virtual make-up similar to realistic make-up can be realized by applying image processing so as to add gloss to the pattern portion of the deep wrinkle. In addition, the pattern of deep wrinkle appearing on the lip is likely to be different for each user, and a unique gloss feeling different for each user is obtained, from reflection of the illumination light on the convex part of the wrinkle from LED lightings LD1, LD2. Lip shape analysis unit 102 outputs image signal LPB1 to wrinkle and gloss control unit 104*a*. In addition, lip shape analysis unit 102 may extract "deep wrinkle to be left" component, by using a filter that passes only a component whose amplitude of the average luminance value is larger than a predetermined value (default value) for deep wrinkle, for example, of lip region image ORG1' in the spatial frequency domain.

Lip shape analysis unit 102 uses HPF 102*h* to extract an image signal including signal components equal to or larger than a second cut-off frequency (predetermined value) of HPF 102*h*, from lip region image ORG1' in the spatial frequency domain (S1023). The image signal corresponds to image signal LPH1 including fine wrinkle CSW1 and noise component NS1 appearing on the lip of user 200 (see FIG. 7). Image signal LPH1 shown in FIG. 7 is an image having a rectangular contour including a lip region, having an image component of fine wrinkle CSW1 and noise component NS1 appearing in the lip region. Fine wrinkle CSW1 and noise component NS1 existing as a high frequency component are extracted by HPF 102*h* as image signal LPH1 in order to suppress degradation of lipstick's texture caused by virtual make-up using lipstick designated by user 200. Lip shape analysis unit 102 outputs the image signal LPH1 to the noise suppression unit 104b. Lip shape analysis unit 102 may extract "fine wrinkle component and noise component to be erased", by using a filter that passes only a component whose amplitude of the average luminance value is smaller than a predetermined value (default value) for fine wrinkle to be erased, for example, of lip region image ORG1' in the spatial frequency domain.

Figure 8:
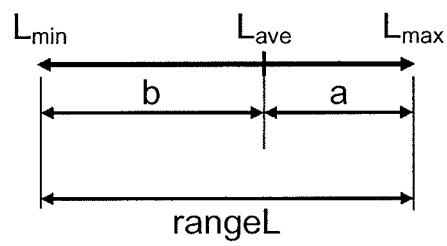
FIG. 8 is an explanatory diagram of an example of color application operation in a color application processing unit.
Figure 8:
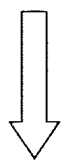
Figure 8:
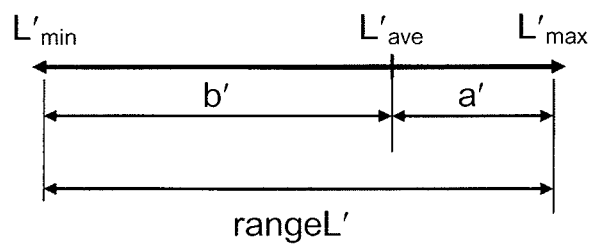

FIG. 8 is an explanatory diagram of an example of color application operation in color application processing unit 103.

In accordance with designation of a cosmetic item (for example, lipstick) for virtual make-up, color application processing unit 103 applies a color corresponding to each designated cosmetic item (for example, lipstick) (that is, color (RGB) of lipstick to be reapplied by user 200) to image signal LPL1 output from lip shape analysis unit 102 (that is, the image signal of the broad shape of the lip). Therefore, color application processing unit 103 converts the color space of lipstick having the RGB color space into a processing intermediate color space (for example, HCL color space) similar to lip shape analysis unit 102, and temporarily stores the conversion result in a memory (for example, plane memory 4).

Since the color application processing on image signal LPL1 by color application processing unit 103 can be realized by referring to the method shown in FIG. 9 to FIG. 16 of International Publication No. 2014/167831 already published as a prior application by the same inventor as this application, for example, only the outline will be explained here using the L channel (luminance) of the HCL color space with reference to FIG. 8, and the detailed explanation will be omitted.

In FIG. 8, the relationship between the representative color (average color) L'ave of the lipstick to be reapplied and the color range rangeL' of the lipstick is maintained as much as possible as the relationship between the representative color (average color) Lave of the original lipstick and the color range rangeL of the lipstick such that a virtual make-up image generated in the virtual make-up gives a sense similar to the color of the original image to human eyes. That is, the relationship of a/b=a'/b' is established with respect to the ratio a/b of the distance a between lip representative color Lave and maximum value Lmax and the distance b between lip representative color Lave and minimum value Lmin and the ratio a'/b' of the distance a' between lip representative color L'ave and maximum value L'max and the distance b' between lip representative color L'ave and minimum value L'min.

A color range adjustment coefficient is provided for contrast adjustment and saturation adjustment of the reapply color, and the color range adjustment coefficient is L'ave/Lave. Color application processing unit 103 scans the pixels constituting image signal LPL1 output from lip shape analysis unit 102 line by line to perform a color application process. Color application processing unit 103 uses the above relationship of a/b=a'/b' and the color range adjustment coefficient (=L'ave/Lave) to apply a color corresponding to each designated cosmetic item (for example, lipstick) (that is, the color of the lipstick to be reapplied by user 200) to each of the pixels constituting image signal LPL 1, thereby generating image signal LPLC1 indicating the broad shape of the lip applied with the color. Color application processing unit 103 outputs image signal LPLC1 indicating the broad shape of the lip applied with the color, to integration processing unit 105. Thus, color application processing unit 103 can maintain the broad shape of the lip region in image signal LPLC1 indicating the broad shape of the lip, without making the lip a flat image by the color application process.

Figure 9:
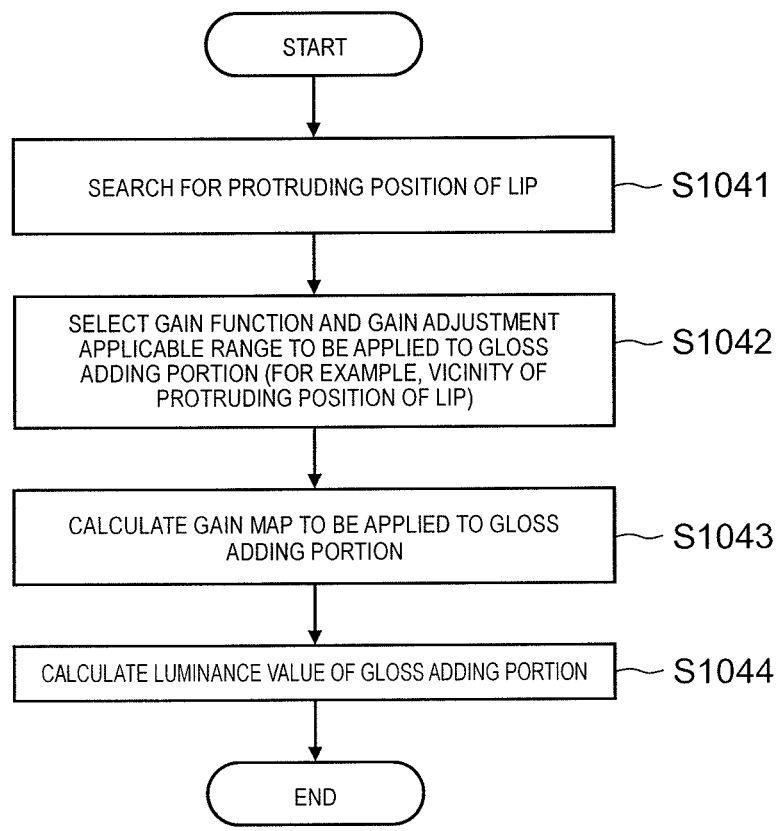
FIG. 9 is a flowchart for explaining in detail an example of an operation procedure of a wrinkle and gloss control unit.
Figure 10A:
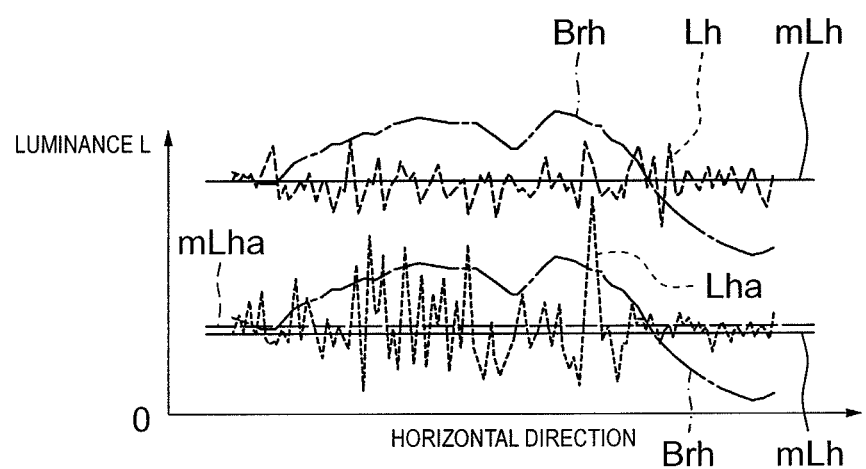
FIG. 10A is a graph showing an example of each luminance distribution before and after adding gloss in the horizontal direction of the lip region.
Figure 10B:
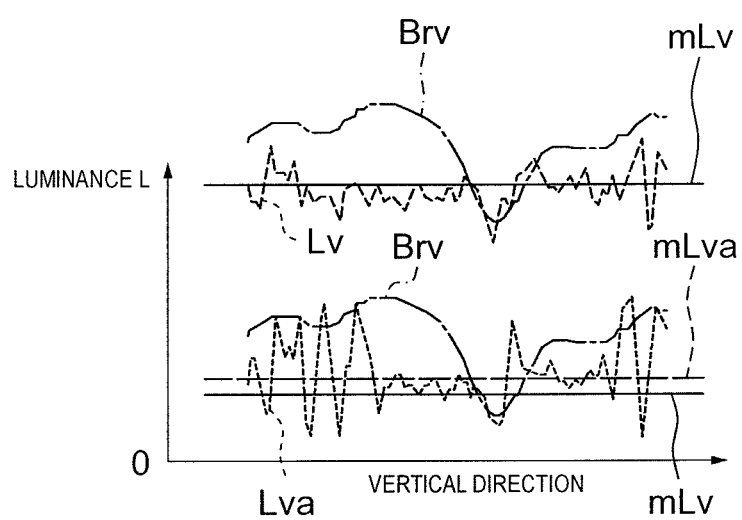
FIG. 10B is a graph showing an example of each luminance distribution before and after adding gloss in the vertical direction of the lip region.

FIG. 9 is a flowchart for explaining in detail an example of an operation procedure of wrinkle and gloss control unit 104a. FIG. 10A is a graph showing an example of each luminance distribution before and after adding gloss in the horizontal direction of the lip region. FIG. 10B is a graph showing an example of each luminance distribution before and after adding gloss in the vertical direction of the lip region.

Wrinkle and gloss control unit 104a of texture control unit 104 performs an image process such that a texture component different for each cosmetic item designated by user 200 is added to a part of the image region of lip region image ORG1'. The object of image processing by wrinkle and gloss control unit 104a (that is, a part of the image region of lip region image ORG1') is a part of pattern MSW1 of deep wrinkle appearing in image signal LPB1 output from lip shape analysis unit 102. That is, wrinkle and gloss control unit 104a adds a unique gloss component different for each designated (selected) cosmetic item (for example, lipstick) to the pattern portion of the deep wrinkle of the lip of user 200 by-image processing. The pattern portion of the deep wrinkle of the lip is the part where unevenness appears in the whole lip (in other words, the part protruding). Therefore, the pattern portion of deep wrinkle of the lip is illuminated with a lot of illumination light from LED lightings LD1, LD2, as shown in FIG. 10A and FIG. 10B, the fluctuation of a predetermined parameter (for example, a luminance value) is also larger as compared with other portions in the lip region, and peak values of a plurality of predetermined parameters are detected.

In FIG. 10A, the horizontal axis represents the position in the horizontal direction and the vertical axis represents the luminance (value) L. FIG. 10A shows curve Brh showing the luminance value of the output of LPF 102l (in other words, the change of the luminance value corresponding to the broad shape of the lip), curve Lh showing the luminance value of the output of BPF 102b (in other words, the change of the luminance value corresponding to a part of the lip region including the pattern portion of a deep wrinkle of the lip), and a straight line mLh showing the average value of the luminance value indicated by curve Lh, in the horizontal direction. FIG. 10A shows, for comparison, with the value on the vertical axis being intentionally shifted, curve Brh, curve Lha indicating the luminance value of the output of BPF 102b, obtained after the gain adjustment, which is a calculation result of the gain map (see below) by wrinkle and gloss control unit 104a, straight line mLh, and straight line mLha showing the average value of the luminance value indicated by curve Lha.

Similarly, in FIG. 10B, the horizontal axis represents the position in the vertical direction and the vertical axis represents the luminance (value) L. FIG. 10B shows curve Bry showing the luminance value of the output of LPF 102l (in other words, the change of the luminance value corresponding to the broad shape of the lip), curve Lv showing the luminance value of the output of BPF 102b (in other words, the change of the luminance value corresponding to a part of the lip region including the pattern portion of a deep wrinkle of the lip), and a straight line mLv showing the average value of the luminance value indicated by curve Lv, in the vertical direction. Further, FIG. 10B shows, for comparison, with the value on the vertical axis being intentionally shifted, curve Brv, curve Lva indicating the luminance value of the output of BPF 102b, obtained after the gain adjustment, which is a calculation result of the gain map (see below) by wrinkle and gloss control unit 104a, straight line mLv, and straight line mLva showing the average value of the luminance value indicated by curve Lva.

Wrinkle and gloss control unit 104a searches for a position (part) protruding in the lip region, based on the luminance value of the output of LPF 102l (in other words, the change in the luminance value corresponding to the broad shape of the lip) (S1041). That is, wrinkle and gloss control unit 104a searches for portions where the surrounding ambient light including the illumination light from LED lightings LD1, LD2 is reflected a lot, in the lip region. For example, in curve Brh of FIG. 10A and curve Bry of FIG. 10B, it is determined by wrinkle and gloss control unit 104a that the part where the luminance value is large (around the peak value) is a part protruding in the lip region.

Wrinkle and gloss control unit 104a sets a pixel region in a predetermined range centered on a pixel indicating a portion protruding in the lip area in step S1041 as an object to which a unique gloss component different for each lipstick designated (selected) by user 200 is added, and selects the gain function and the gain adjustment applicable range corresponding to the lipstick (S1042). Wrinkle and gloss control unit 104a calculates a gain map for adjusting the luminance value of each pixel of an object to which a unique gloss component different for each lipstick designated (selected) by user 200 is added (that is, the pixel region in the above-described predetermined range) (S1043). The gain map shows, for example, a gain distribution of each pixel, used when adjusting the luminance value of each pixel constituting an object to which a gloss component is to be added (that is, in the above-described pixel region in the predetermined range).

Wrinkle and gloss control unit 104a adjusts and calculates the luminance value of each pixel of an object to which a unique gloss component different for each lipstick designated (selected) by user 200 is added (that is, the pixel region in the above-described predetermined range) by using the gain map calculated in step S1043 (S1044).

Figure 10C:
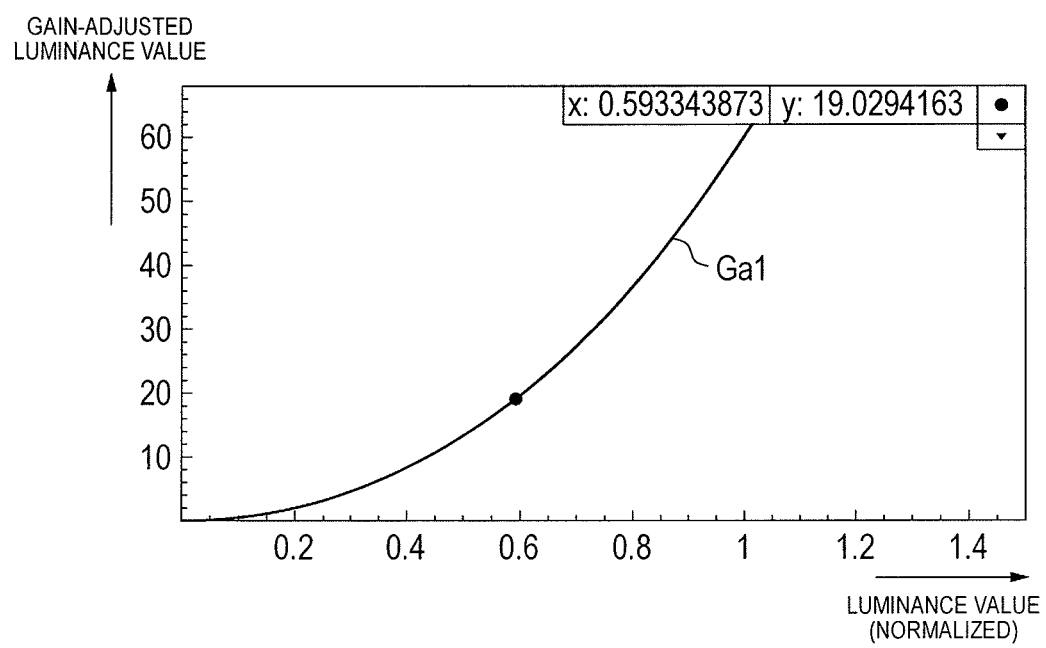
FIG. 10C is a graph showing an example of a gain function.

Here, the gain function (see FIG. 10C) and gain adjustment applicable range selected in step S1042 are different for each lipstick designated (selected) by user 200. FIG. 10C is a graph showing an example of a gain function. In FIG. 10C, the horizontal axis represents the luminance value (normalized using the maximum luminance value), the vertical axis represents the luminance value after the gain adjustment, and the curve Ga of the gain function corresponding to the lipstick designated (selected) by user 200 is shown. Curve Ga is indicated by, for example, a function of $\beta \times (luminance)\ \alpha$, as an adjustment function for adjusting the gain. For example, although $\alpha$ is 2.2 and $\beta$ is 60, it goes without saying that $\alpha$ and 13 are not limited to these values. In a case where as one point on the curve Ga, for example, the normalized luminance value of a certain pixel constituting the image of the pattern portion of the deep wrinkle of the lip which is the output of the BPF 102b is "0.593343873", wrinkle and gloss control unit 104a adjusts and calculates the gain (1.0, for example) according to the luminance value on the horizontal axis such that the luminance value (output value of the gain function) of the pixel is "19.0294163", as a result of applying the gloss component.

FIG. 11A is a schematic diagram showing an example of an output image of wrinkle and gloss control unit 104a.

Wrinkle and gloss control unit 104a performs the process of adding a gloss component corresponding to lipstick designated (selected) by user 200 to image signal LPB1 which is the output of BPF 102b from lip shape analysis unit 102 (FIG. 9), so it is possible to generate image signal LPBG1 which has a gloss component with a strong shiny sense like lip gloss (gloss), for example. Alternatively, wrinkle and gloss control unit 104a performs the process of adding a gloss component corresponding to lipstick designated (selected) by user 200 to image signal LPB1 which is the output of BPF 102b from lip shape analysis unit 102 (FIG. 9), so it is possible to generate image signal LPBM1 which has a gloss component with a strong metallic feel, for example. With respect to image signal LPBG1 and image signal LPBM1, lipsticks to be selected respectively are different, and specific gloss components are added but the range to which gloss components are added also differs. This is because, as described above, the gain function and the gain adjustment applicable range selected in step S1042 are different for each lipstick.

As described above, wrinkle and gloss control unit 104a can clearly add a unique gloss component different for each cosmetic item (for example, lipstick) designated (selected) by user 200 to the object portion image of a virtual make-up (for example, a part of lip region image ORG1'), and can reproduce the texture corresponding to the cosmetic item virtually and clearly, without applying a real cosmetic item. Wrinkle and gloss control unit 104a outputs image signal LPBG1 which adds a unique gloss component corresponding to lipstick to a portion protruding in the lip region and a predetermined range around the port to integration processing unit 105.

Noise suppression unit 104b of texture control unit 104 suppresses the noise component included in the predetermined parameter (for example, luminance) of the high band component, using image signal LPH1 of HPF 102h output from lip shape analysis unit 102. For example, noise suppression unit 104b suppresses fine wrinkle CSW1 and noise component NS1 of the lip, by lowering the gain (for example, 1.0) of a predetermined parameter (for example, luminance value) in pixels constituting an image of fine wrinkle CSW1 of the lip and noise component NS1 included in image signal LPH1. Alternatively, the noise suppression method by noise suppression unit 104b may be a technique other than the gain down method described above.

Noise suppression unit 104b makes the above-described adjustment amount of gain down (that is, the amount of gain to be lowered) different for each cosmetic item (for example, lipstick) designated (selected) by user 200. This makes it possible to flexibly change suppression of fine wrinkle and noise component which are different for each cosmetic item (for example, lipstick) designated (selected) by user 200, and virtual make-up apparatus 100 can present a more appropriate virtual make-up image to user 200. Noise suppression unit 104b outputs image signal LPHnr1 in which fine wrinkle CSW1 of the lip and noise component NS1 are suppressed by a certain amount, to integration processing unit 105.

FIG. 11B is a schematic diagram showing an example of an output image of noise suppression unit 104b.

Noise suppression unit 104b can generate image signal LPHnr1 in which fine wrinkle CSW1 of the lip and noise component NS1 are suppressed by a certain amount, with respect to image signal LPH1 which is the output of HPF 102h from lip shape analysis unit 102.

Integration processing unit 105 as an example of the display control unit superimposes the output image of texture control unit 104 on the output image of color application processing unit 103 to generate make-up layer image LAY1' as an example of a layer image, and outputs it to make-up superposition processing unit 106. Specifically, integration processing unit 105 generates make-up layer image LAY1' by superimposing image signal LPBG1 which adds a unique gloss component corresponding to lipstick to a portion protruding in the lip region and a predetermined range around the portion and image signal LPHnr1 in which the fine wrinkle CSW1 of the lip and noise component NS1 are suppressed by a certain amount on image signal LPLC1 indicating the broad shape of the lip applied with the color.

More specifically, the integration processing unit 105 generates make-up layer image LAY1' by using image signal LPLC1, image signal LPBG1, and image signal LPHnr1 and calculating k×(pixel value constituting image signal LPLC1)+m×(pixel value constituting image signal LPBG1)+n×(pixel value constituting image signal LPHnr1). The pixel values constituting each image signal are luminance values as an example of a predetermined parameter. However, the pixel value is not limited to only the luminance value, but may include lightness and saturation. Here, k is 1.0, in is a real number between 0.0 and 1.0, and n is a real number between 0.0 and 1.0.

Further, when make-up layer image LAY1' is generated, integration processing unit 105 inverse-converts the processing intermediate color space (for example, HCL color space) of make-up layer image LAY1 into a color space (for example, RGB, or it is possible to inverse-convert YUV) that can be represented by the device (for example, display 5), and outputs the conversion result (that is, see make-up layer image LAY1 shown in FIG. 12) to make-up superposition processing unit 106.

FIG. 12 is an explanatory diagram of an example of an operation outline of generation of virtual make-up image VMU1 in make-up superposition processing unit 106.

Make-up superposition processing unit 106 as an example of the display control unit superimposes a layer image on the object portion image of a virtual make-up (that is, lip region image ORG1) of facial image ORG0, and displays on display 5, a virtual make-up image obtained by applying the virtual make-up using items on the facial image. Specifically, make-up superposition processing unit 106 generates virtual make-up image VMU1 by synthesizing lip region mask image MSK1 and lip region image ORG1 having an RGB color space which are output from lip region extraction unit 101 and make-up layer image LAY1 having an RGB color space by integration processing unit 105.

More specifically, make-up superposition processing unit 106 generates virtual make-up image VMU1 by extracting (cutting out) the shape portion of the lip in make-up layer image LAY1 by using lip region mask image MSK1 and superimposing make-up layer image LAY1 of only the extracted shape portion of the lip on original lip region image ORG1. For example, make-up superposition processing unit 106 generates virtual make-up image VMU1, by {p×(make-up layer image LAY1)×(lip region mask image MSK1)}+{(1−p)×(original lip region image ORG1)}. p is a real number between 0.0 and 1.0. In FIG. 12, virtual make-up image VMU1 has a rectangular size including the lip region to which the virtual make-up is applied in order to make the description easy to understand. However, the facial image of user 200 captured by camera 120 is used as an original image, and make-up layer image LAY1 extracted by using lip region mask image MSK1 may be superimposed on the facial image.

As described above, virtual make-up apparatus 100 of the present exemplary embodiment extracts an object portion image of a virtual make-up (for example, lip region image ORG1) from original facial image ORG0 captured by camera 120, and applies lip region image ORG1' which has been converted to have the color space of HCL from the color space RGB with the color of the cosmetic item (for example, lipstick) which has been converted to have the color space of HCL from the color space RGB, in accordance with the designation of the cosmetic item (for example lipstick) of the virtual make-up. Virtual make-up apparatus 100 adds a texture component different for each cosmetic item (for example, lipstick) to lip region image ORG1' (a portion of the object portion image). Virtual make-up apparatus 100 superimposes an image obtained by cutting out only a lip region of make-up layer image LAY1 by using lip region mask image MSK1 on lip region image ORG1 to be subjected to virtual make-up to generate virtual make-up image VMU1 which has been subjected to the virtual make-up, and displays it on display 5.

Thus, virtual make-up apparatus 100 virtually gives a unique texture component different for each cosmetic item to the facial image of user 200 to allow user 200 to enjoy the virtual make-up. Therefore, virtual make-up apparatus 100 performs image processing of virtual make-up for each frame of the individual facial image of user 200, so it is possible to make user 200 properly confirm the atmosphere of the lip after the virtual make-up (for example, shiny state, good coloring, or wrinkle feeling), with the broad-shaped movement of the lip, for example, when user 200 suddenly opens his mouth, thereby improving the user's convenience.

For example, if a customer who visits a store in the future can preliminarily perform a virtual make-up using a cosmetic product selected by himself before purchasing a cosmetic product (for example, lipstick), it can be expected that a concrete impression at the time of actual use can be confirmed and as a result the willingness of the customer to purchase increases. In addition, for customers who are concerned about whether or not to purchase, the fact that the customers can virtually experience various textures of cosmetic products (for example, lipstick) is one appeal to the store side in terms of sales strategy, and it can also be expected that sales of a cosmetic product increase.

Further, virtual make-up apparatus 100 sets a pixel region in a predetermined range centered on a peak position of a predetermined parameter (for example, luminance value) of a predetermined band component of lip region image ORG1' (that is, a position (pixel) at which a peak of a luminance value of the image signal of the output of LPF 102*l* is obtained), as an object to which a gloss component is added. Virtual make-up apparatus 100 adds a texture component different for each lipstick, using the output value of the adjustment function (gain function) of a luminance value different for each lipstick, for each luminance value in the pixel region. Thus, since each user has different broad shape and position of deep wrinkle of lip, virtual make-up apparatus 100 can add a unique texture component different for each lipstick selected by the user to the pattern portion of deep wrinkle of the lip, and effectively present the image after the virtual make-up to the user.

Further, the pixel region in the predetermined range to which the luminance value is adjusted using the gain function described above is different for each cosmetic item (for example, lipstick). Thus, virtual make-up apparatus 100 adjusts the gain of a predetermined parameter (for example, luminance value) by varying the range of the object of the lip to which gloss is added, for each cosmetic item selected by the user, and therefore, for example, virtual make-up image VMU1 by which the user can enjoy textures of gloss, matte, cream, luster, liquid lip color or the like, or fine differences for each type of textures in the gross even with the same gloss can be presented to the user.

Virtual make-up apparatus 100 suppresses the noise component included in a predetermined parameter (for example, luminance) of a high band component of lip region image ORG1' to be subjected to virtual make-up. Thus, virtual make-up apparatus 100 suppresses the noise component by a certain amount to be able to obtain clear virtual make-up image VMU1 and to suppress degradation of the visibility of virtual make-up image VMU1.

Further, virtual make-up apparatus 100 superimposes an output image after adding the texture component (for example, image signal LPBG1) on the output image after the color application process (image signal LPLC1). With this superimposition, virtual make-up apparatus 100 can generate make-up layer image LAY1 having an RGB color space from the HCL color space.

While various exemplary embodiments have been described with reference to the drawings, it is to be understood that the present disclosure is not limited thereto. It is apparent to those skilled in the art that changes and modifications are conceivable within the scope described in the claims, and it would be appreciated that those naturally belong to the technical scope of the present disclosure. Further, within the scope not deviating from the gist of the present disclosure, respective constituent elements in the above exemplary embodiment may be combined.

In the above-described embodiment, the lip is exemplified as the portion to be subjected to virtual make-up, and the details have been described. However, the portion to be subjected to virtual make-up is not limited to the lip, and for example, the present invention can be applied to the surroundings of the eyes (that is, the eyes). In other words, the present invention can be used for virtual make-up for adding shadows to the surroundings of the eyes (especially, eyelids), like an eye shadow.

In the above-described exemplary embodiment, a specific exemplary embodiment of the virtual make-up apparatus according to the present disclosure has been described. However, the exemplary embodiment can be applied to a virtual make-up method performed by the virtual make-up apparatus according to the present disclosure, and also can applied to a virtual make-up program causing the virtual make-up apparatus according to the present disclosure, which is a computer, to implement each process of the virtual make-up method according to the present disclosure.

INDUSTRIAL APPLICABILITY

The present disclosure is useful as a virtual make-up apparatus, a virtual make-up method, and a virtual make-up program, which performs virtual make-up on a face video while virtually giving a unique texture different for each cosmetic product, and improve user's convenience.

REFERENCE MARKS IN THE DRAWINGS

2 IMAGING CONTROL CIRCUIT
3 INPUT PIXEL MEMORY
4 PLANE MEMORY
5 DISPLAY
6 STORAGE
7 MEDIUM CONTROL CIRCUIT
8 COORDINATE DETECTION CIRCUIT
9 GUI CONTROL UNIT
10 IMAGE PROCESSING APPARATUS
100 VIRTUAL MAKE-UP APPARATUS
101 LIP REGION EXTRACTION UNIT
102 LIP SHAPE ANALYSIS UNIT
102$b$ BPF (Band Pass Filter)
102$h$ HPF (High Pass Filter)
102$l$ LPF (Low Pass Filter)
103 COLOR APPLICATION PROCESSING UNIT
104 TEXTURE CONTROL UNIT
104$a$ WRINKLE AND GLOSS CONTROL UNIT
104$b$ NOISE SUPPRESSION UNIT
105 INTEGRATION PROCESSING UNIT
106 MAKE-UP SUPERPOSITION PROCESSING UNIT
110 HOUSING
120 CAMERA
130 DISPLAY WITH TOUCH PANEL
200 USER
210 FACE
220 FINGER
300 VIRTUAL MAKE-UP SCREEN
LD1, LD2 LED LIGHTING

The invention claimed is:

1. A virtual make-up apparatus comprising:
a processor that performs a process comprising:
storing cosmetic item information of a plurality of cosmetic items of different colors for use in a virtual makeup displayed on a display;
storing a different texture component for each stored cosmetic item of a specific color in association with each stored cosmetic item;
extracting an object portion image of a virtual make-up from a facial image captured by a camera;
extracting color information with regard to the object portion image;
in accordance with designation of an item of the virtual make-up corresponding to a stored cosmetic item, outputting a color image by applying a color corresponding to the designated item on the object portion image;
outputting a texture image by adding a texture component to a part of the object portion image, wherein the texture component is generated based on analyzed color information and is different for each designated item corresponding to a stored cosmetic item, the texture component for a specific cosmetic item being generated from a texture component stored in association with the specific cosmetic item of a specific color;
displaying, on a display, a virtual make-up image in which the virtual make-up using the designated item is applied on the facial image, by using the color image, the texture image, and the object portion image of the virtual make-up of the facial image;
setting a pixel region in a predetermined range centered on a pixel indicating a peak position of a predetermined parameter of a predetermined band component of the object portion image as a part of the object portion image; and
adding a different texture component to each designated item by using an output value of an adjustment function of the predetermined parameter different for each designated item for each predetermined parameter in the pixel region.

2. The virtual make-up apparatus of claim 1, wherein the pixel region in the predetermined range is different for each designated item.

3. The virtual make-up apparatus of claim 1, wherein the process performed by the processor further comprises suppressing a noise component included in a predetermined parameter of a high band component of the object portion image.

4. The virtual make-up apparatus of claim 1,
wherein the process performed by the processor further comprises generating the virtual make-up image by superimposing a layer image in which the texture image is superimposed on the color image, on the object portion image of the virtual make-up of the facial image.

5. A virtual make-up method comprising:
storing cosmetic item information of a plurality of cosmetic items of different colors for use in a virtual makeup displayed on a display;
storing a different texture component for each stored cosmetic item of a specific color in association with each stored cosmetic item;
extracting with a processor an object portion image of a virtual make-up from a facial image captured by a camera;
extracting with the processor color information with regard to the object portion image;
in accordance with designation of an item of the virtual make-up corresponding to a stored cosmetic item, outputting with the processor a color image by applying a color corresponding to the designated item on the object portion image;
outputting with the processor a texture image by adding a texture component to a part of the object portion image, wherein the texture component is generated based on analyzed color information and is different for each designated item corresponding to a stored cosmetic item, the texture component for a specific cosmetic item being generated from a texture component stored in association with the specific cosmetic item of a specific color;
displaying on a display, a virtual make-up image in which the virtual make-up using the designated item is applied on the facial image, by using the color image, the texture image, and the object portion image of the virtual make-up of the facial image;
setting a pixel region in a predetermined range centered on a pixel indicating a peak position of a predetermined parameter of a predetermined band component of the object portion image as a part of the object portion image; and
adding a different texture component to each designated item by using an output value of an adjustment function of the predetermined parameter different for each designated item for each predetermined parameter in the pixel region.

6. A virtual make-up method comprising:
storing cosmetic item information of a plurality of cosmetic items of different colors for use in a virtual makeup displayed on a display;
storing a different texture component for each stored cosmetic item of a specific color in association with each stored cosmetic item;
receiving, with a processor, a facial image captured by a camera;
extracting, with the processor, an object portion image from the facial image;
extracting, with the processor, information with regard to a color space of the extracted object portion image;
designating, with the processor, an item of the virtual makeup from a plurality of items of the virtual makeup, stored in a memory, in response to a user input corresponding to a stored cosmetic item;
applying, with the processor, a color corresponding to the designated item on the extracted object portion image;
generating, with the processor, a texture component based on the designated item and the extracted information with regard to the color space of the extracted object portion image, the texture component corresponding to a stored cosmetic item, and the texture component for a specific cosmetic item being generated from a texture component stored in association with the specific cosmetic item of a specific color;
applying, with the processor, the generated texture component on the extracted object portion image;
displaying, with a display, the facial image with the extracted object portion image on which the color corresponding to the designated item and the generated texture component are applied;
setting a pixel region in a predetermined range centered on a pixel indicating a peak position of a predetermined parameter of a predetermined band component of the object portion image as a part of the object portion image; and
adding a different texture component to each designated item by using an output value of an adjustment function of the predetermined parameter different for each designated item for each predetermined parameter in the pixel region.

* * * * *